United States Patent [19]
Papadopoulou et al.

[11] Patent Number: 6,044,208
[45] Date of Patent: Mar. 28, 2000

[54] INCREMENTAL CRITICAL AREA COMPUTATION FOR VLSI YIELD PREDICTION

[75] Inventors: Evanthia Papadopoulou, Elmsford; Mark Alan Lavin, Katonah, both of N.Y.

[73] Assignee: International Business Machines Corporation, Armonk, N.Y.

[21] Appl. No.: 09/070,834

[22] Filed: Apr. 30, 1998

[51] Int. Cl.[7] .................................................. G06F 17/50
[52] U.S. Cl. ................................. 395/500.05; 395/500.2
[58] Field of Search .................................... 364/488, 489, 364/490, 491; 395/500.2, 500.05, 500.06

[56] References Cited

U.S. PATENT DOCUMENTS

| | | | |
|---|---|---|---|
| 3,751,647 | 8/1973 | Maeder et al. | 395/500.2 |
| 5,438,527 | 8/1995 | Feldbaumer et al. | 395/500.2 |
| 5,544,256 | 8/1996 | Brecher et al. | 382/149 |
| 5,649,169 | 7/1997 | Berezin et al. | 395/500.44 |
| 5,754,432 | 5/1998 | Komatsuzaki et al. | 395/500.2 |
| 5,773,315 | 6/1998 | Jarvis | 438/14 |
| 5,777,901 | 6/1998 | Berezin et al. | 395/500.2 |
| 5,841,893 | 11/1998 | Ishikawa et al. | 382/145 |

OTHER PUBLICATIONS

Wagner and Koren "An Interactive VLSI CAD Tool for Yield Estimation," IEEE Transactions on Semiconductor Manufacturing, vol. 8, No. 2, May 1995, pp. 130–138.

Allan and Walton "Efficient Critical Area Estimation for Arbitrary Defect Shapes," Proceedings of the 1997 IEEE International Symposium on Defect and Fault Tolerance in VLSI Systems, Oct. 20–22, 1997, pp. 20–28.

Stapper and Rosner "Integrated Circuit Yield Management and Yield Analysis: Development and Implementation," IEEE Transactions on Semiconductor Manufacturing, vol. 8, No. 2 May 1995, pp. 95–102.

*Primary Examiner*—Kevin J. Teska
*Assistant Examiner*—Leigh Marie Garbowski
*Attorney, Agent, or Firm*—Whitham, Curtis & Whitham; Stephen C. Kaufman

[57] ABSTRACT

An efficient method to compute critical area for shorts and breaks in rectilinear layouts in Very Large Scale Integrated (VLSI) circuits. The method is incremental and works in the $L_\infty$ geometry and has three major steps: Compute critical area for rectilinear layouts for both extra material and missing material defects (i.e., shorts and opens) by modeling defects as squares (which corresponds to the $L_\infty$ metric) instead of circles (Euclidean geometry). Treat the critical region for shorts and opens between any two edges or corners of the layout as a rectangle that grows uniformly as the defect radius increases. This is valid for rectilinear layouts and square defects ($L_\infty$ metric). Use an incremental critical area algorithm for shorts and opens, which are computed for rectilinear layouts assuming square defects. Non-rectilinear layouts are approximated, first, by a rectilinear layout using a shape processing tool. The critical area for the rectilinear approximation is computed using the preferred incremental method.

10 Claims, 9 Drawing Sheets

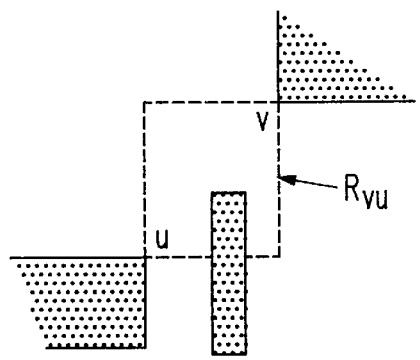 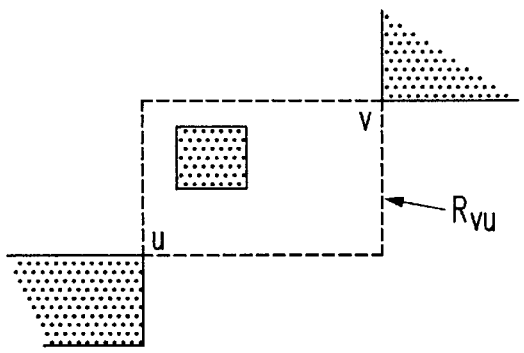
FIG.2A    FIG.2B
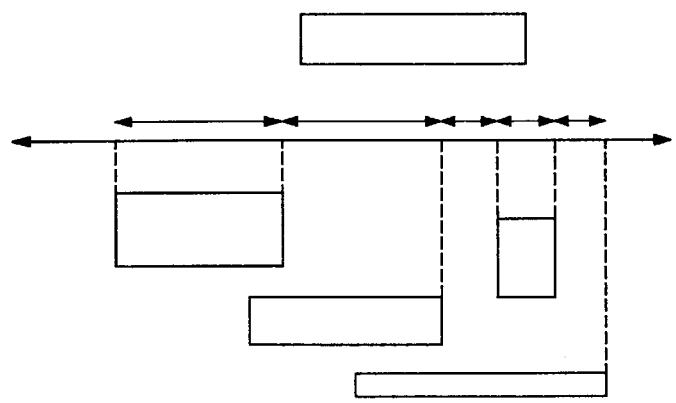
FIG.6

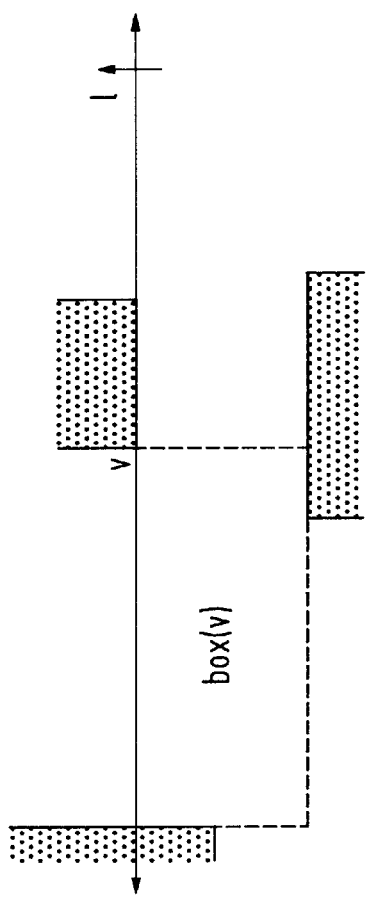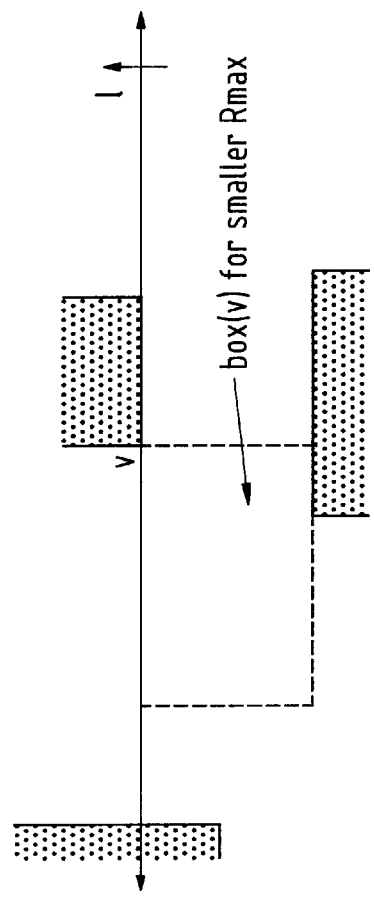

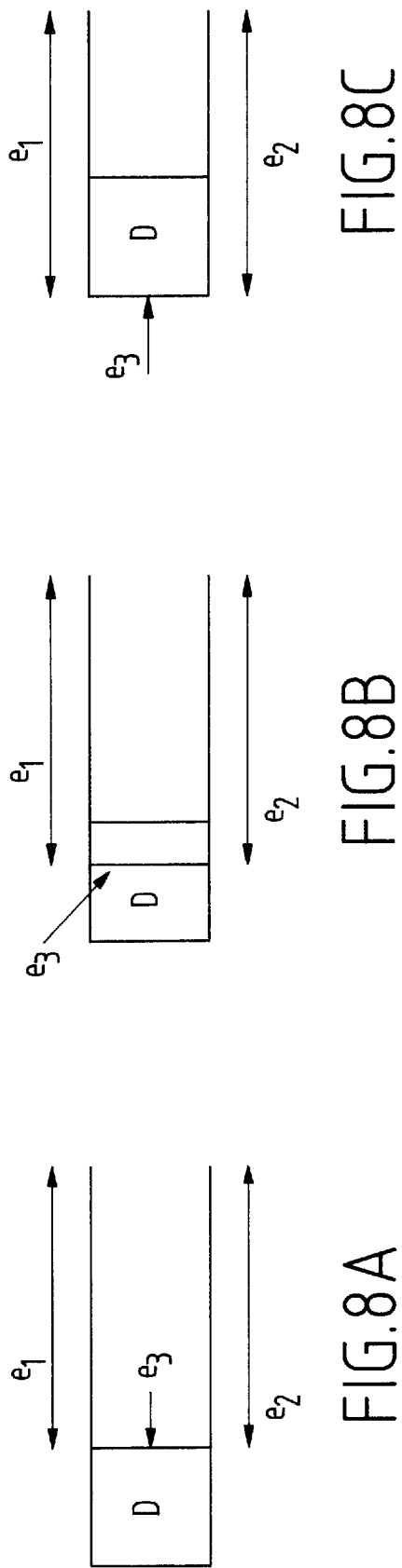

INCREMENTAL CRITICAL AREA COMPUTATION FOR VLSI YIELD PREDICTION

CROSS-REFERENCE TO RELATED APPLICATION

This application is related in subject matter to the disclosure of application Ser. No. 09/085,093 filed May 26, 1998, for "A Incremental Method for Critical Area and Critical Region Computation of Via Blocks" by M. Lavin, E. Papadopoulou and G. Tellez, assigned to a common assignee and incorporated herein by reference.

DESCRIPTION

BACKGROUND OF THE INVENTION

1. Field of the Invention

The present invention generally relates to yield estimation techniques for large complex circuit designs and, more particularly, to an incremental method for critical area computation of shorts and opens in very large scale integrated (VLSI) circuits.

2. Description of the Prior Art

Yield prediction is of growing importance in modern VLSI design due to the need for reducing the cost of manufacturing. Yield estimation techniques for large complex designs are based on the concept of critical area which provides an analytical formulation for yield loss caused by defects occurring during fabrication.

For examples of state of the art yield prediction techniques, see, W. Maly and J. Deszczka, "Yield Estimation Model for VLSI Artwork Evaluation", *Electron Lett.*, vol. 19, no. 6, pp. 226–227, March 1983, C. H. Stapper, "Modeling of defects in integrated circuits photolithographic patterns", *IBM J. Research and Development*, vol. 28, no. 4, pp. 461–475, 1984, W. Maly, "Modeling of lithography related yield losses for CAD of VLSI circuits" *IEEE Transactions on Computer-Aided Design*, vol. CAD-4, no. 3, pp. 166–177, July 1985, A. V. Ferris-Prabhu, "Modeling the Critical Area in Yield Forecast", *IEEE Journal of Solid State Circuits*, vol. SC-20, No. 4, Aug. 1985, pp. 874–878, J. Pineda de Gyvez and C. Di, *IEEE Transactions on Computer-Aided Design*, vol. 11, no. 5, pp. 638–658, May 1992, I. A. Wagner and I. Koren, "An Interactive VLSI CAD Tool for Yield Estimation", *IEEE Transactions on Semiconductor Manufacturing*, Vol. 8, No. 2, 1995, pp. 130–138, and C. H. Stapper and R. J. Rosner, "Integrated Circuit Yield Management and Yield Analysis: Development and Implementation" *IEEE Transactions on Semiconductor Manufacturing*, Vol.8, No.2, 1995, pp. 95–101).

Fabrication defects are caused by contaminants in materials and equipment. The formula used to compute critical area is the following according to I. A. Wagner and I. Koren, ibid., $$A_c = \int_0^\infty A(r)D(r)dr \quad (1)$$

where $A_c$ denotes the critical area, $A(r)$ denotes the area in which the center of a defect of radius r must fall in order to cause circuit failure, and $D(r)$ is the density function of the defect size. Based on experimental data, $D(r)$ is given by the following formula:

$$D(r) = \begin{cases} \dfrac{cr^q}{r_0^{q+1}}, & 0 \leq r \leq r_0 \\ \dfrac{cr_0^{p-1}}{r^p}, & r_0 \leq r \leq \infty \end{cases}$$

where p, q are real numbers (typically p=3, q=1), c=(q+1)(p−1)/(q+p), and $r_0$ is some minimum optically resolvable size. See C. H. Stapper, ibid., A. V. Ferris-Prabhu, "Defect size variations and their effect on the critical area of VLSI devices", *IEEE Journal of Solid State Circuits*, vol. SC-20, No. 4, Aug. 1985, pp. 878–880, and I. Koren, "The effect of scaling on the yield of VLSI circuits", *Yield Modeling and defect Tolerance in VLSI circuits*, W. R. Moore, W. Maly, and A. Strojwas, Eds., Bristol UK: Adam-Hilger Ltd., 1988, pp. 91–99.

Essentially, there are two types of contamination caused manufacturing defects: extra material, causing shorts between different conducting regions and missing material, causing open circuits. Because of missing material we get two kinds of defects: breaks and via blocks. A break is an area of missing material that breaks a conducting region into two distinct pieces, therefore breaking an intended connection. Via blocks are missing material defects that overlap with vias and thus destroy the connection between elements of the same net in different layers. Among these different types of defects, shorts are the most important ones because they are the main reason for yield loss in current technologies.

SUMMARY OF THE INVENTION

It is therefore an object of the present invention to provide a new and efficient method to compute critical area for shorts and breaks in rectilinear layouts.

According to the invention, the critical area for open shapes or breaks in rectilinear layouts is computed. The total critical area may be further determined by combining the method of the present invention with the method for computing Via Blocks in application Ser. No. 09/085,093, (Attorney Docket Number YO9-97-223). Non-rectilinear layouts are approximated by a rectilinear approximation and, then, analyzed using the preferred embodiment method. The preferred embodiment method is an incremental determination based on square rather than circular defects. The present invention includes three major steps:

1. Compute critical area for rectilinear layouts for both extra material and missing material defects (i.e., shorts and opens) by modeling defects as squares (which corresponds to the $L_\infty$ metric) instead of circles (Euclidean geometry). This model considerably simplifies critical area computation for rectilinear layouts.
2. Treating the critical region for shorts and opens between any two edges or corners of the layout as a rectangle that grows uniformly as the defect radius increases. This is valid for rectilinear layouts and square defects ($L_\infty$ metric).
3. Using an incremental critical area algorithm for shorts and opens, which are computed for rectilinear layouts assuming square defects. Non-rectilinear layouts are approximated, first, by a rectilinear layout using a shape processing tool such as Niagara from International Business Machines Corporation. Then, the critical area for the rectilinear approximation is computed using the preferred incremental method.

BRIEF DESCRIPTION OF THE DRAWINGS

The foregoing and other objects, aspects and advantages will be better understood from the following detailed description of a preferred embodiment of the invention with reference to the drawings, in which:

FIGS. 2A and 2B, illustrating examples of non-matching corners;

FIGS. 5A and 5B are diagrams respectively illustrating examples of a box(v);

FIG. 6 illustrates a sweep-line 1 sweeping shapes;

FIGS. 3A–E represent defects affecting aligned edges; and

DETAILED DESCRIPTION OF A PREFERRED EMBODIMENT OF THE INVENTION

The $L_\infty$ Metric

In the state of the art defect modeling techniques, defects are modeled, consistently, as circles. The underlying reason for modeling defects as circles is the common use of Euclidean geometry. Distance between two points, typically, is measured by the length of a line segment joining the two points. This is the Euclidean distance or the $L_2$ metric. The locus of points at unit distance from a center point is usually called the "unit circle". In Euclidean geometry, the "unit circle" is a circle of radius one.

In reality, defects need not be circular. In fact they can have any shape. Thus, as the inventors of the present invention have found, other than the Euclidean geometries, although not normally used, may be used and simplify the computation of critical area. See also U.S. application Ser. No. 09/085,093, (Attorney Docket Number YO9-97-223).

Therefore, according to the preferred embodiment of the present invention, critical area is computed in the $L_\infty$ metric, i.e., for rectilinear layouts for both missing and extra material defects (i.e., shorts and opens). In $L_\infty$ metric, the distance between two points $p=(x_p, y_p)$ and $q=(x_q, y_q)$ is $d(p, q)=\max\{|x_p-x_q|, |y_p-y_q|\}$.

Thus, the "unit circle" in the $L_\infty$ metric, is a square of side two. Computing critical area for square defects is equivalent to computing critical area in $L_\infty$ geometry. Since as noted above, defects may have any shape, modeling defects as squares does not compromise accuracy in yield prediction in comparison to modeling defects as circles.

Critical Regions for Shorts in $L_\infty$

As referred to herein, an element of the layout is an edge or vertex of a given layout. A defect of size r is represented as a square of side 2r (i.e., radius r) and the layout is treated as consisting of rectilinear shapes. The critical region between any two elements cQf the layout for a defect size r is the locus of points where, if the defect is centered, it will overlap with both elements. The seed critical region between two elements is the minimal critical region induced by the elements. The critical radius of two elements is the size (radius) of the defect inducing the seed critical region between two elements. Properties of seed critical regions are described herebelow.

Figure 1A:
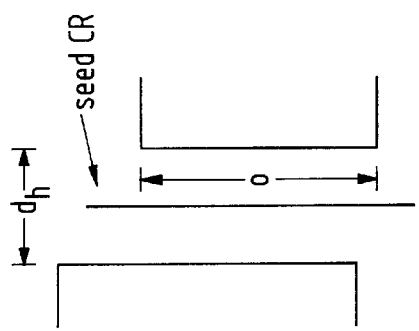
FIGS. 1A, 1B, 1C, and 1D are diagrams illustrating critical seed regions.

So, for example in FIG. 1A, consider two horizontal edges $e_1, e_2$ such that their vertical projections overlap. Let $o(e_1,e_2)$ denote the length of the overlap and $d_v(e_1,e_2)$ denote the vertical distance between $e_1$ and $e_2$.

Property 1: The seed critical region of two horizontal edges $e_1, e_2$ is a horizontal segment of length $o(e_1,e2)+d_v(e_1,e_2)$ whose axis is at distance $d_v(e_1,e2)/2$ from both $e_1$ and $e_2$, and whose middle point is vertically aligned with the middle point of the overlap. The critical radius of $e_1, e_2$ is $r_c(e_1,e_2)=d_v(e_1,e_2)/2$.

Figure 1B:
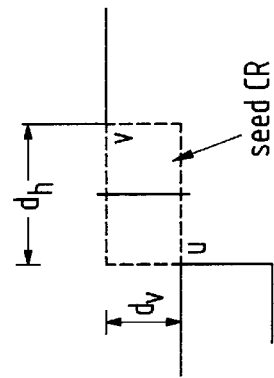

Similarly, for two vertical edges $e_1, e_2$ in FIG. 1B, where $d_h(e_1,e_2)$ denotes the horizontal distance between $e_1$ and $e_2$.

Property 2: The seed critical region of two vertical edges $e_1, e_2$ is a vertical segment of length $o(e_1,e_2)+d_h(e_1,e_2)$ whose axis is at distance $d_h(e_1,e_2)/2$ from both $e_1$ and $e_2$ and whose middle point is horizontally aligned with the middle point of the overlap. The critical radius of $e_1, e_2$ is $r_c(e_1,e_2)=d_h(e_1,e_2)/2$.

Figure 1C:
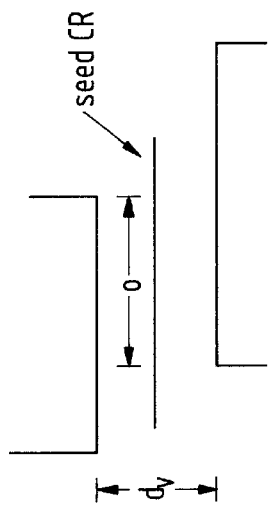
Figure 1D:
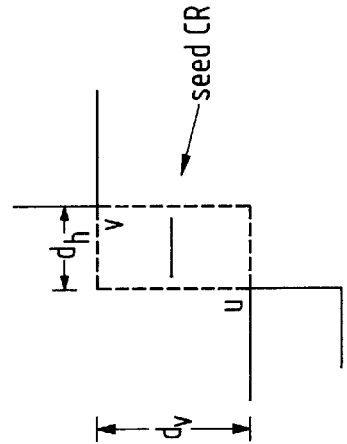

Consider now two corners $v_1, v_2$ such that the vertical projections of the incident horizontal edges as well as the horizontal projections of the incident vertical edges do not overlap as in FIGS. 1C and 1D. Let $d_v(v_1,v_2)$ and $d_h(v_1,v2)$ denote the vertical and the horizontal distance between $V_1$ and $v_2$, respectively. Corners $v_1, v_2$ induce a rectangle indicated by the dashed line and denoted $R_{vu}$ in FIGS. 1C and 1D. If $R_{v_1v_2}$ is empty, i.e., $R_{v_1v_2}$ does not overlap with another element of the given layout, then $v_1, v_2$ are referred to as matching. In FIGS. 1C and 1D, corners v and u are matching; In FIGS. 2A and 2B, corners v and u are not matching because $R_{vu}$ is not empty.

Property 3: The seed critical region of two corners $v_1, v_2$ is a horizontal or vertical line segment centered at the midpoint of $R_{v_1v_2}$ of length $|d_v(v_1,v_2)-d_h(v_1,v_2)|$. In particular, if $d_v(v_1,v_2)>d_h(v_1,v_2)$, the seed critical region is a horizontal line segment; if $d_v(v_1,v_2)<d_h(v_1,v_2)$, the seed critical region is a vertical line segment; if $d_v(v_1,v_2)=d_h(v_1,v_2)$, i.e., $R_{v_1v_2}$ is a square, then the seed critical region is the midpoint of $R_{v_1v_2}$. The critical radius of $v_1, v_2$ is $r_c(v_1,v_2)=d(e_1,e_2)/2$, where $d(e_1,e_2)=\max\{d_h(e_1, e_2), d_v(e_1,e_2)\}$ is the $L_\infty$ distance between $v_1$ and $v_2$.

Figure 3E:
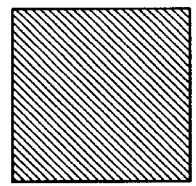
Figure 3B:
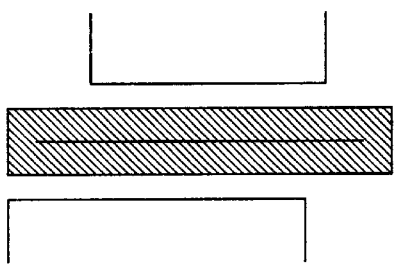
FIGS. 3A, 3B, 3C, and 3D are diagrams illustrating critical regions for a square defect shown in FIG. 3E.
Figure 3D:
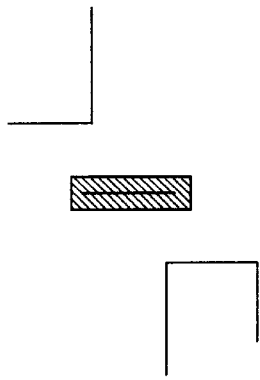
Figure 3A:
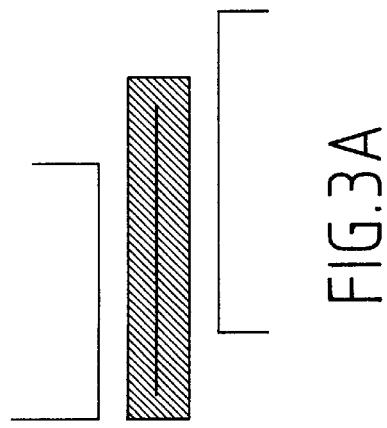
Figure 3C:
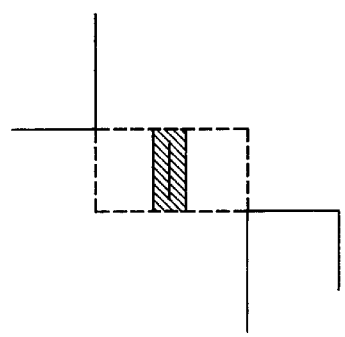

Given two elements and a defect radius larger than the critical radius for these two elements, the critical region produced by these two elements must be a rectangle whose size depends on the size of the seed critical region and the critical radius. FIGS. 3A, 3B, 3C, and 3D show the critical regions for the square defect of FIG. 3E. In particular, we have the following property:

Property 4: The critical region induced by two elements $e_1, e_2$ for a defect of radius r is a rectangle centered at the midpoint of the seed critical region with width $w=2(r-r_c(e_1,e_2))$ and length $l=w+l_s(e_1,e_2)$, where $r_c(e_1,e_2)$ is the critical radius and $l_s(e_1,e_2)$ is the length of the seed critical region. (Note that $r \geq r_c(e_1,e_2)$.)

Note that for two vertical or horizontal edges, the length of the critical region can be written as $l=2r+o(e_1,e_2)$, which becomes $l=2r-\min\{d_h(e_1,e_2), d_v(e_1,e_2)\}$ for two corners. The width of the critical region can be written as $w=2r-d(e_1,e_2)$, where $d(e_1,e_2)=\max\{d_h(e_1,e_2), d_v(e_1,e_2)\}$, i.e., the $L_\infty$ distance.

As is evident from the above properties, seed critical regions are vertical or horizontal line segments (a point is a degenerate line segment). From Property 4, it is clear that the critical region between any two elements is a rectangle that expands uniformly as the defect radius increases. Note that the seed critical region can be regarded as a degenerate rectangle of width 0. Given a defect radius r, let CR(r) denote the total critical region of the given layout. Clearly, CR(r) is the union of the critical regions of all pairs of elements whose critical radius is less or equal to r. From the above properties, CR(r) must be a collection of rectilinear shapes.

A seed critical region between two elements $e_1$ and $e_2$ is referred to as redundant if it is totally contained within the total critical region CR(r) for some radius $r<r_c(e_1,e_2)$, where $r_c(e_1,e_2)$ is the critical radius of $e_1$ and $e_2$. Clearly redundant seed critical regions are of no interest and thus pairs of elements whose seed critical region is redundant need not be considered for critical area estimation.

The following lemma identifies the three categories of pairs of elements that can produce non-redundant seed critical regions. Two horizontal edges $e_1$ and $e_2$ are said to be vertically visible if there a exists a vertical line segment l with endpoints on both $e_1$ and $e_2$, that does not intersect any shape of the layout. Similarly, two vertical edges $e_1$ and $e_2$ are said to be horizontally visible if there exists a horizontal line segment with endpoints on $e_1$ and $e_2$ that does not intersect any shape of the Layout.

Lemma 1: Non-redundant seed critical regions can only be induced by the following pairs of elements:
1) Pairs of vertically visible horizontal edges in two disjoint shapes;
2) Pairs of horizontally visible vertical edges in two disjoint shapes; and
3) Matching pairs of corners in two disjoint shapes.

Note that the above lemma 1 does not imply that the seed critical regions induced by the above three categories of pairs of elements are always non-redundant. However, any pair not falling in these categories must be redundant. Thus, we only need to compute seed critical regions of pairs in the above three categories.

The seed critical region of vertically visible horizontal edges are always horizontal line segments; while the seed critical regions of horizontally visible vertical edges are always vertical line segments. The seed critical regions of matching pairs of corners are either vertical or horizontal. We can partition matching corners into those that produce vertical and those that produce horizontal seed critical regions. As the following lemma provides, the partition can be made according the orientation of the length and width of the rectangle they define.

Lemma 2: The seed critical region of two matching corners u, v is a horizontal (resp. vertical) line segment, if and only if, the longer sides of $R_{uv}$ are vertical (resp. horizontal). If $R_{uv}$ is a square, then the seed critical region is a point.

It can be shown that the total number of strictly non-redundant seed critical regions is linear in the number of edges of the layout.

Lemma 3: The number of non-redundant seed critical regions is O(n) where n is the number of edges of the given layout.

Thus, in FIG. 4, which is a flow diagram for the preferred embodiment steps in determining critical regions for shorts, first in step 100, design shapes are retrieved and in step 102 the retrieved shapes are unioned to eliminate overlapping or redundant shapes. Then, in step 104, defect radii are retrieved, preferably in increasing order.

The seed critical regions can be computed in step 106 in two passes. First, all horizontal seed critical regions are computed and, then, all vertical seed critical regions are computed. Details on how to compute all non-redundant seed critical regions are described hereinbelow. However, first, an incremental algorithm to compute critical area is described by assuming that seed critical regions are available.

Computing Critical Area for Shorts

For the preferred embodiment method, the goal is to compute the critical area provided in equation (1). Thus, for the preferred embodiment, discrete values are computed for equation (1) for the list of defect radii R retrieved in step 104. Thus, for every distinct retrieved radius $r_i \in R$, the area of the critical region, $A(r_i)$, is computed.

However, there is no need to recompute critical regions from scratch for each defect radius. Instead, by pre-computing seed critical regions and organizing the results in a priority queue according to increasing critical radii in step 106; Then, using Property 4, the area of the total critical region may be computed, incrementally, for every radius $r \in R$ in increasing order.

After first initializing in step 108, wherein $CR_i$ denotes the collection of critical region shapes for radius $r_i$ unified into a collection of non-overlapping shapes; once determined, $Cr_i$ will consist of disjoint rectilinear shapes that may contain holes. Each radius, $r_i$, has two kinds of critical regions: 1) critical regions of pairs of elements that have already contributed to $CR_{i-1}$, and 2) new critical regions of pairs of elements whose critical radius is between $r_i$ and $r_{i-1}$. In the former case, the critical region can be derived by simply expanding $CR_{i-1}$ by $dr=r_{i-1}$ in steps 110 and 112. In the latter case, new critical regions appear. $CR_i$ can be computed incrementally as follows:

1. In steps 110 and 112, expand $CR_{i-1}$ by $dr=r_i-r_{i-1}$.
2. Compute $CR_{new}$, the collection of critical regions of pairs of elements whose critical radius is between $r_i$ and $r_{i-1}$. According to the following steps:
   (a) In step 114, as provided in detail in FIG. 4B, a set of seed critical regions in step 1140 is initialized; pop from a priority queue (SEEDS) in step 1144, all seed critical regions of critical radius $r_c$, $r_{i-1} \leq r_c \leq r_i$ (step 1142); and combine the popped seed critical regions with the set of seed critical regions in step 1146.
   (b) In step 116, as provided in detail in FIG. 4C, after initializing $CR_{new}$ in step 1160, for each seed critical region popped from the priority queue in step 1162, compute the rectangular critical region shape using the formulas of property 4 in step 1164. Let $CR_{new}$ be the collection of these rectangles collected in step 1166 and returned as $Cr_{new}$ in step 1168.
3. In step 118, union $CR_{new}$ and the expanded $CR_{i-1}$; Let the result be $CR_i$.
4. In step 120, compute the area of $CR_i$.

Note that once seed critical regions have been popped out of the priority queue, they need not be considered again. In step 122 the computed area $A_i$ and its associated critical region $CR_i$ are output for calculation of the critical area $A_c$ in step 124.

Computing Seed Critical Regions

Non-redundant seed critical regions determined in step 106 may be computed fairly simply. For example, labeling the corners as NW, NE, SW, and SE, to find seed critical regions between matching pairs of NW and SE corners as well as between matching pairs of NE and SW corners. As noted above, the seed critical regions can be computed in two passes. In the first pass, all horizontal seed critical regions are computed, and, in the second pass compute all vertical seed critical regions are computed. The computation of seed critical regions between pairs of vertical and horizontal edges can be easily done by plane sweep, i.e., by applying a horizontal sweep line l sweeping the layout from bottom to top. Let $R_{max}$ denote the maximum defect radius.

Given a corner v, let box(v) denote the rectangle obtained by the vertical and horizontal projection of v until either a horizontal or vertical edge is reached or the length of the projection reaches $R_{max}$. For South corners, the vertical projection is emanating downwards, while for North corners, it is emanating upwards. For East corners, the horizontal projection emanates to the right, while for West corners, it emanates to the left.

For example, FIGS. 5A and 5B show the box of a SW corner v. For a SW corner v, all NE corners v must be identified within box(v) that are matching with v, i.e, $R_{uv}$ is empty (similarly for other kinds of corners). Moreover, for horizontal (resp. vertical) seed critical regions, only corners v such that the length of $R_{uv}$ is vertical (resp. horizontal) need be identified.

The problem of identifying matching corners is basically the maxdominance problem described by M. J. Atallath and S. R. Kosaraju, "An Efficient Algorithm for Maxdominance, with Applications", *Aigorithmica*, 1989, 4, pp. 221–236. All pairs of matching corners can be identified using the maxdominanice algorithm of Atallah and Kosaraju in time O(nlogn+t) where t is the number of matching pairs. However, preferably, for ease of implementation, a much simpler algorithm is used that cannot achieve the same theoretical time complexity bound but produces adequate results.

By lemma 2, the condition under which a seed critical region between two corners u, v is horizontal is that the length of $R_{uv}$ be vertical. This condition referred to herein as the horizontal seed condition. The vertical seed condition for two corners u, v is that the length of $R_{uv}$ be horizontal.

In the preferred embodiment, all horizontal seed critical regions are identified by performing a plane sweep from bottom to top, i.e., by applying a horizontal sweep line l sweeping the layout from bottom to top. There are two major components associated with a plane-sweep algorithm: an event list and a sweep-line status. The event list contains of priority values at which the sweep-line status changes. The sweep-line status contains information about the status of the sweeping process. The sweep-line status is preferably implemented as a height-balanced binary tree.

The event list contains the ordinates of shapes plus the ordinates of north edges augmented by $R_{max}$. The sweep-line status contains all edges vertically visible from the sweep line at distance less than or equal to $R_{max}$. Thus, the vertical projections to the sweep-line are kept within distance $R_{max}$, of all edges vertically visible from the sweep line. FIG. 6 illustrates a sweep-line l sweeping shapes from which a list of projections are kept in the sweep-line status. The events are partitioned in three types: 1) South events corresponding to the occurrence of south edges, 2) North events corresponding to the occurrence of north edges, and 3) Max-distance events corresponding to a projection reaching distance $R_{max}$ from its edge. (When a projection reaches distance $R_{max}$ from its edge it should be deleted from the sweep-line status.) Initially the sweep line status is empty and the event list is initialized to the ordinates of all horizontal edges. Events are processed in increasing order.

For every event, the sweep line status is updated as follows:

1. A south event corresponds to the occurrence of a south edge e. The endpoints of e are located on the sweep-line status and all projections p are enumerated on the sweep-line status between the endpoints. Every such projection corresponds to a north edge e' vertically visible from e. If e and e' are not part of the same shape, a horizontal seed critical region is induced whose size and location is given by property 1. After the seed critical regions are produced all projections that are overlapping with e are deleted from the sweep-line status. The projections where the endpoints of e fall are truncated by the endpoints of e. If both endpoints fall on the same projection p, the projection is split into two parts. (The Max-distance event associated with p also is split into two events, see step 2 for the definition of a Max-distance event.)

To identify the seed critical regions induced by the SW (resp. SE) corner incident to e, the sweep line is scanned to the left (resp. right) to identify matching corners to v. The scan is performed until either a vertical edge is encountered or, $R_{max}$ is reached or, the horizontal seed condition is violated. Scanning left (resp. Right), every NE corner encountered is clearly within box(v). Those NE (resp. NW) corners with a y coordinate below some NE (resp. NW) corner seen so far are ignored because they do not match v. For every NE (resp. NW) matching corner found during the scan the seed critical region as in property 3 is reported. (Note that the first time that a NE (resp. NW) corner u is encountered such that the length of $R_{uv}$ is horizontal (i.e., the horizontal seed condition is violated) the scan stops; the reason is that, for any other matching corner to the left (resp. right) of u, the length of $R_{uv}$ must also be horizontal and therefore the seed critical region is vertical.)

2. A north event corresponds to the occurrence of a north edge e. The endpoints of e on the sweep-line status are located and all the projections between the endpoints are deleted from the sweep-line status; A new projection p corresponding to e is inserted. Furthermore, a new Max-distance event is created with priority value $R_{max}$ plus the ordinate of e and inserted into the event list.

3. A Max-distance event associated with a north edge e corresponds to the deletion from the sweep-line status of the projections induced by e.

To identify all vertical seed critical regions, a similar plane sweep is made from left to right. The sweep line keeps all the visible horizontal projections of vertical edges at distance less than or equal to $R_{max}$ from the sweep line. When a NW (resp. SW) corner is encountered, the sweep line scans upwards (resp. downwards) until either a horizontal edge is encountered or $R_{max}$ is reached or, the vertical seed condition is violated.

Because of the sweep line scans, the asymptotic worst case time complexity of the above algorithm is quadratic. However, in practice, the number of corners visited during the scan should be small on average. The first metal (M1) level, for example, consists of long wires and thus not a lot of matching corners occur.

Computing Critical Area for Opens

Critical area for opens can be computed in a similar incremental fashion. As noted above, an open is a defect that destroys the connection of a single conducting region. Opens are partitioned into two kinds oat defects: Via Blocks and Breaks. The critical area for opens is the total critical area combining both breaks and Via Blocks.

A single conducting region on a single layer is generally a polygon with contacts to other conducting regions in other layers. Strictly speaking, a break is a defect that splits a conducting region into two pieces each one containing a contact or via. For the preferred embodiment, this definition is simplified to make the critical area computation easier. As for the description above where the defect is a short, the layout is taken as rectilinear and defects as squares, i.e., using the $L_\infty$ geometry. So, for defects being a break, each break will be one of the following three cases:

1. The defect overlaps two horizontal vertically visible edges of the same shape;
2. The defect overlaps two vertical horizontally visible edges of the same shape; and
3. The defect overlaps with a pair of matching corners in the same shape.

Figure 7A:
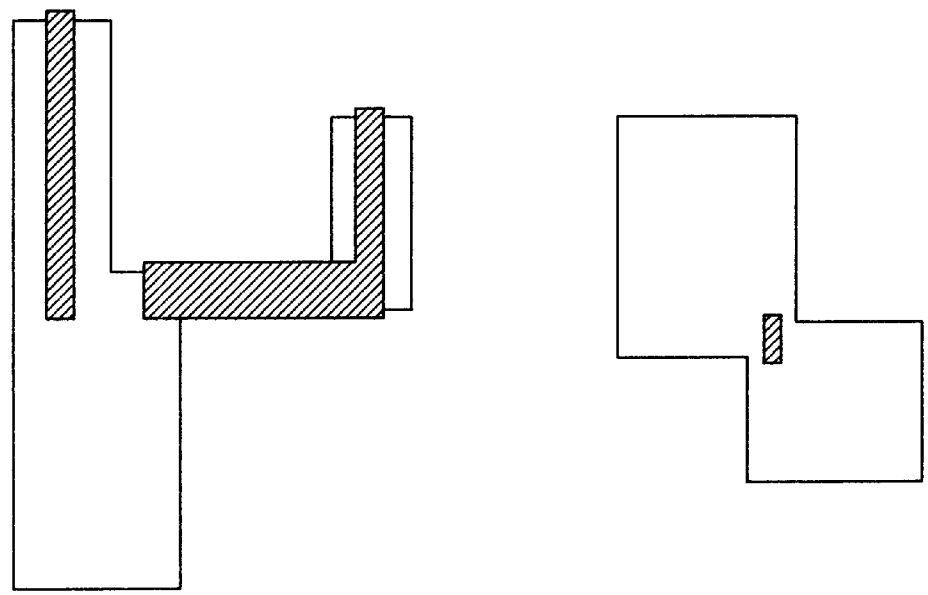
FIG. 7A illustrates the critical regions (shaded) of two shapes for a given defect.
Figure 7B:
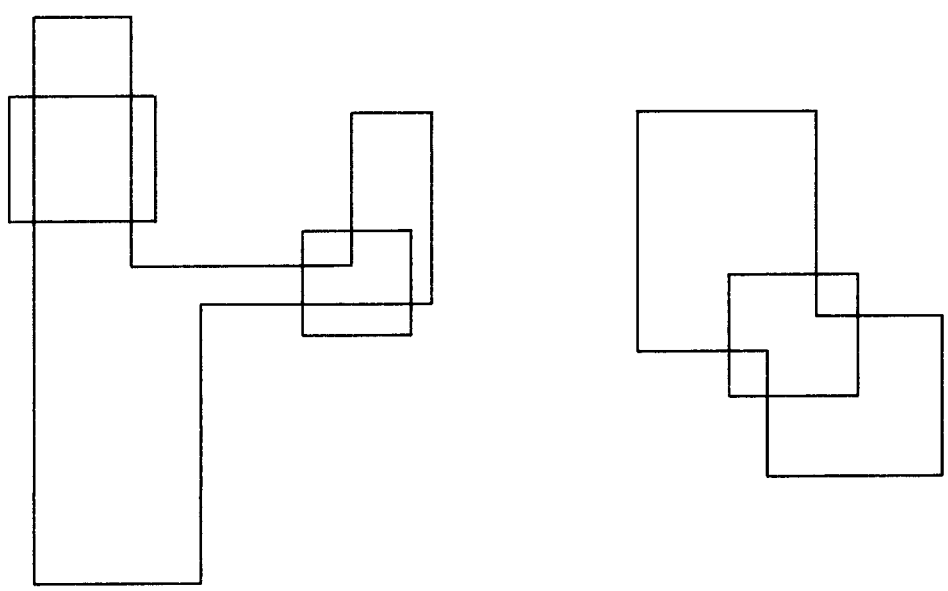
FIG. 7B represents defects causing opens in the critical areas of FIG. 7A.

FIG. 7A illustrates the critical regions (shaded) of two shapes for a given defect and FIG. 7B represents defect causing opens in those critical areas.

FIGS. 8A–E represent defects affecting what are referred to as aligned edges, e.g., two horizontal vertically visible edges (resp. vertical horizontally visible edges) $e_1$, $e_2$ incident to the same vertical (resp. horizontal) edge $e_3$. In FIG. 8A, a defect (D) touching $e_3$ lying in the exterior of the shape should not be considered an open although it trivially overlaps $e_1$, and $e_2$. Similarly, in FIG. 8B, if the defect overlaps the shape only by a small amount it should not be considered a break.

However, in FIGS. 8C and 8D, a minimal defect overlapping $e_1$, and $e_2$, causes an open, i.e., the side of the defect spans the vertical (resp. horizontal) distance between $e_1$ and $e_2$. Presumptively, D causes an open if it overlaps (touches) $e_1$, $e_2$, overlapping non-trivially with the interior of the shape, and $e_3$ does not intersect the interior of D (D may touch $e_3$). Finally, as represented in FIG. 8E, any larger defect that totally contains a minimal defect D causes an open (it need not break the shape in two pieces, if the shape is sufficiently foreshortened).

Consequently, the above definition for a break is augmented in the case of aligned pairs of edges. For aligned pairs of edges, a defect must be considered a break if it contains in its interior a defect of minimum size causing a break. A minimum size defect is assumed to be a break if it satisfies this condition.

Note that a large enough defect satisfying any of the above conditions may not break the polygon into two pieces. However, for a conductive line, for example, a defect that destroys a considerable part of the conducting region may be considered an open. So, in foreshortening a line there is a high probability of reducing contact coverage and, therefore, such a defect would cause an open circuit.

Theoretically, shapes may contain redundant regions, i.e., regions that are not conducting. Any defect falling over such a redundant region would not harm the circuit. However, it is safe to ignore such redundant regions and assume that each shape is required as part of a layout. Thus, if a defect breaks a shape into two pieces, it also breaks a conducting region into two pieces and, therefore, causes a fault.

To achieve greater accuracy in the critical area computation for opens, the computation of critical area for breaks is is combined with an incremental computation of critical area for Via Blocks in $L_\infty$, as described in U.S. application Ser. No. 09/085,093 (Attorney Docket Number YO9-97-223) and the combined result is reported as the critical area for opens.

Figure 4A:
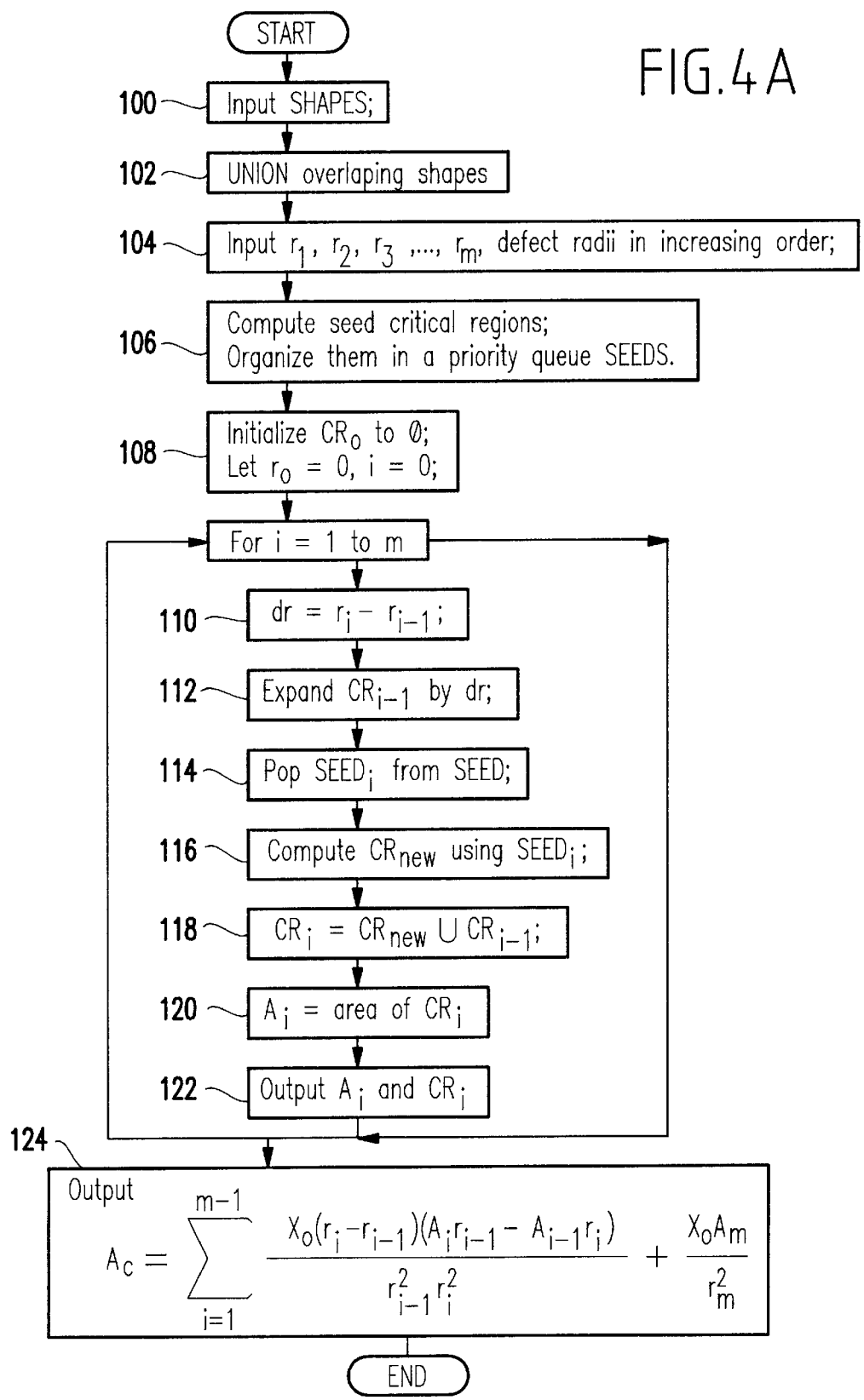
FIG. 4A–C are flow diagrams for the preferred embodiment steps in determining critical regions for shorts or opens.
Figure 4B:
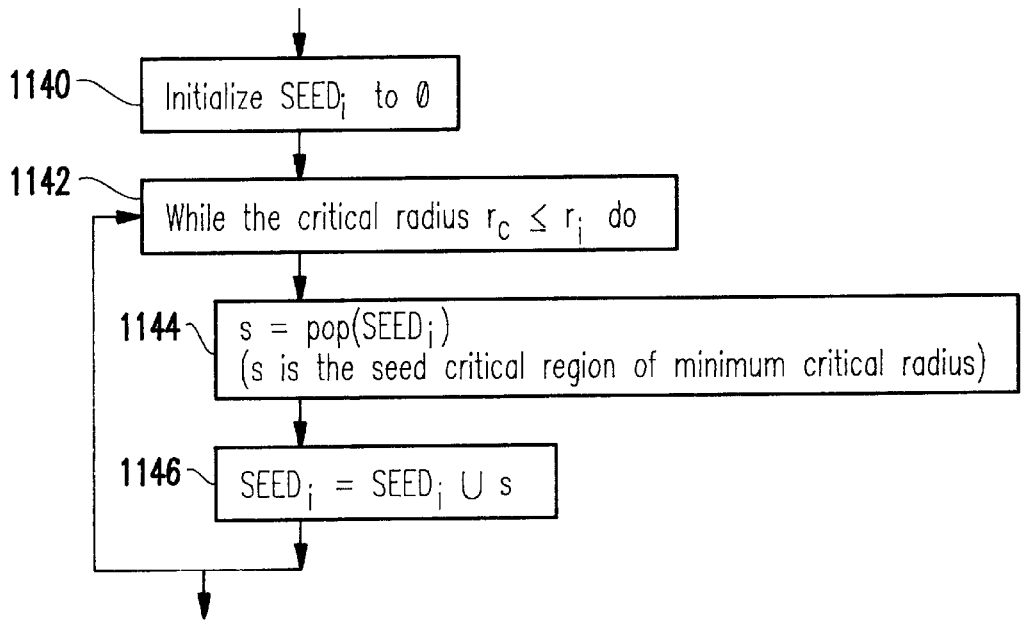
Figure 4C:
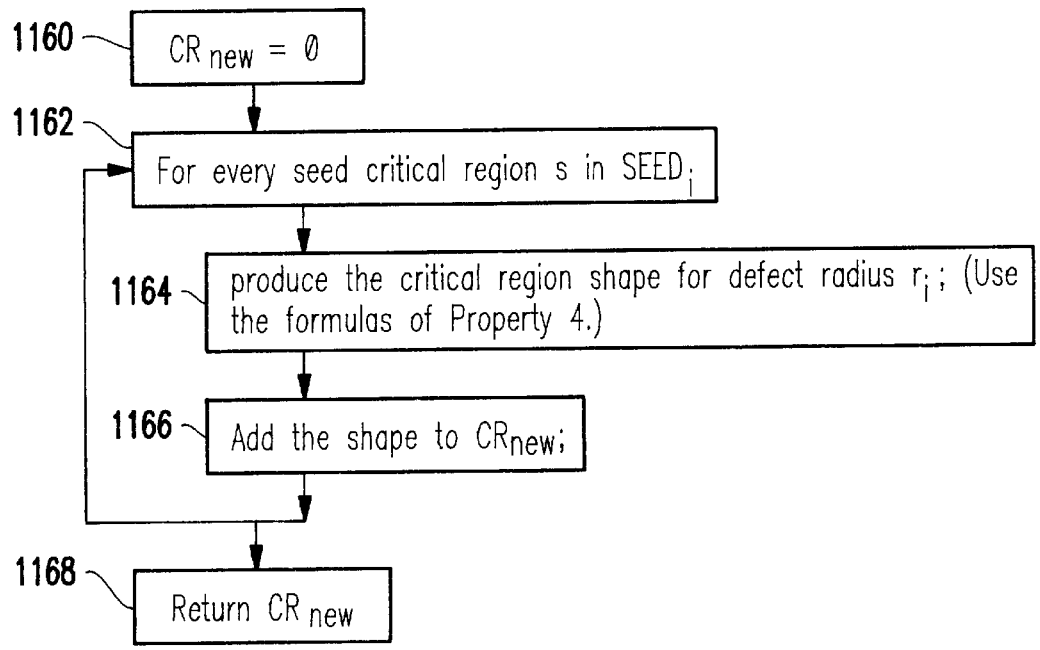
Figure 9:
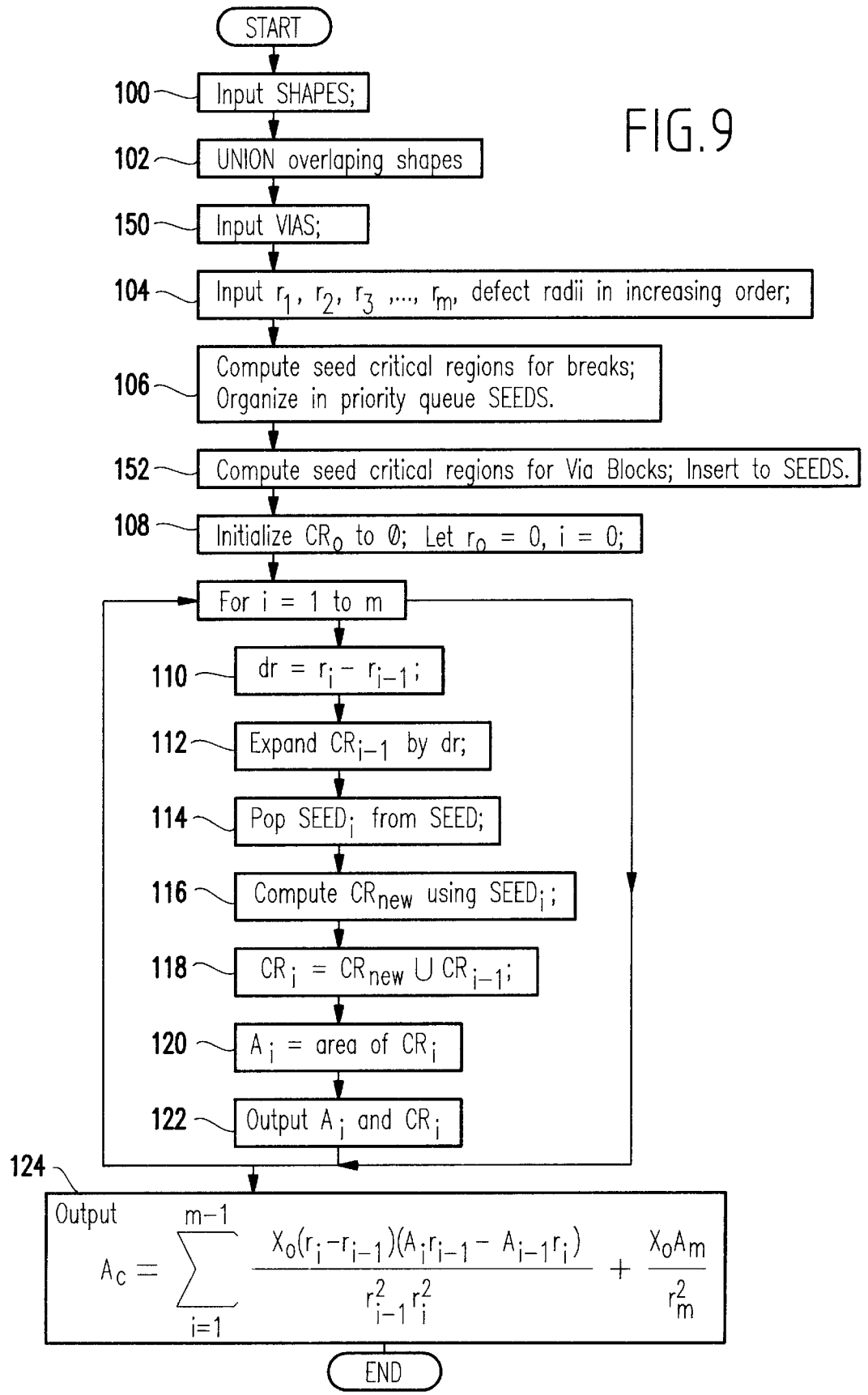
FIG. 9 show a flow diagram of a preferred embodiment method to achieve greater accuracy in the critical area computation for opens.

FIG. 9 shows a flow diagram of a preferred embodiment method of computing critical area for breaks and is similar to the that for shorts in FIGS. 4A–C, except for pairs of edges that are incident to the same edge. Accordingly, like or similar blocks are numbered identically.

First, seed critical regions between pairs of elements are computed in each of the above three categories. Then, critical area is incrementally computed as was done above for shorts, with properties 1, 2 and 3 being unaltered.

However, for pairs of edges that are incident to the same edge the length of seed critical regions must be readjusted. As in properties 1 and 2, $d_v(e_1,e_2)$, $d_h(e_1,e_2)$ and $o(e_1,e_2)$ denote the vertical distance, the horizontal distance, and the amount of overlap between $e_1$ and $e_2$, respectively. Properties 1 and 2 above are replaced with properties 5 and 6, respectively, as follows:

Property 5: The seed critical region for opens of two horizontal edges $e_1$, $e_2$ is a horizontal segment at vertical distance $d_v(e_1,e_2)/2$ from $e_1$ and $e_2$ of the following length:
1. If $e_1$ and $e_2$ are aligned, (i.e., they are incident to a common vertical edge $e_3$) the seed critical region has length $o(e_1,e_2$ ) and appears at horizontal distance $d_v(e_1,e_2)/2$ from $e_3$.
2. If $e_1$ and $e_2$ are not aligned, the seed critical region has length $o(e_1,e_2)+d_v(e_1,e_2)$ and its middle point is vertically aligned with the middle point of the overlap.

The critical radius of $e_1$, $e_2$ is $r_c(e_1,e_2)=d_v(e_1,e_2)/2$.

Property 6: The seed critical region of two vertical edges $e_1$, $e_2$ is a vertical segment at horizontal distance $d_h(e_1,e_2)/2$ from $e_1$ and $e_2$ of the following length:
1. If $e_1$ and $e_2$ are aligned (i.e., they are incident to a common horizontal edge $e_3$) the seed critical region has length $o(e_1,e_2)$ and appears at vertical distance $d_h(e_1,e_2)/2$ from $e_3$.
2. If $e_1$ and $e_2$ are not aligned the seed critical region has length $o(e_1,e_2)+d_h(e_1,e_2)$ and its middle point is horizontally aligned with the middle point of the overlap.

The critical radius of $e_1$, $e_2$ is $r_c(e_1,e_2)=d_h(e_1,e_2)/2$.

Property 3 remains the unaltered.

To achieve greater accuracy in the preferred critical area computation for opens, the computation of critical area for breaks is combined with retrieving Vias in step 150 and the incremental computation of critical area for Via Blocks in $L_\infty$ in step 152 according to U.S. application Ser. No. 09/085,093 and the combined critical area is reported as the critical area for opens.

Thus, determining minimal critical regions is identical to determining seed critical regions described hereinabove. For simplicity, any subsequent description herein of determining seed critical regions is intended to apply also to determining minimal critical regions.

Critical area computation for opens may be determined, first by letting $CR_i$ denote the total critical region for opens for radius $r_i$. $CR_i$ is the union of all critical region shapes for both breaks and blocks for radius $r_i$. $CR_i$ includes disjoint rectilinear shapes that may contain holes and is computed as follows:

1. Expand $CR_{i-1}$, by $dr=r_i-r_{i-1}$
2. Compute $CRBR_{new}$ as the collection of new critical regions for breaks induced by pairs of elements whose critical radius is between $r_{i-1}$ and $r_i$ (similar to computing critical regions shorts).
3. Compute $CRVB_{new}$ as the collection of new critical regions for Via Blocks induced by vias that have not produced critical region so far (see U.S. application Ser. No. 09/085,093

4. Union $CRBR_{new}$, $CRVB_{new}$, and the expanded $CR_{i-1}$; let the result be $CR_i$.

5. Compute the area of $CR_i$.

Computing seed critical regions within a rectilinear polygon, i.e., computing seed critical regions for breaks can be done by plane sweep as described hereinabove. The plane sweep is simpler for breaks because each polygon may be treated independently.

For a typical rectilinear polygon P, the events are partitioned in three types as above: 1) South events corresponding to south edges; 2) North Events corresponding to North edges; and 3) Maxdistance events corresponding to a projection reaching distance $R_{max}$ from a South edge. The event-list is initialized to the ordinates of all North and South edges. The sweep line status is initially empty. Events are processed in increasing order. For every event the sweep line status gets updated as follows:

1. A south event corresponds to the occurrence of a south edge e. The endpoints of e are located on the sweep-line status and, all the projections between the endpoints are deleted from the sweep-line status; New projection p corresponding to e is inserted. Further, a new Max-distance event is created with priority value $R_{max}$ plus the ordinate of e and it is inserted into the event list. If both endpoints of e fall on the same projection p, the projection is split into two parts and the Max-distance event associated with p also is split.

2. A north event corresponds to the occurrence of a north edge e. The endpoints of e are located on the sweep-line status and all projections p on the sweep-line status between the endpoints are enumerated. Every such projection corresponds to a south edge e' vertically visible from e and, thus, a horizontal seed critical region is induced. If e and e' are aligned the size of the seed critical region is given by property 6.1; Otherwise, it is given by property 6.2. After the seed critical regions are produced, all projections that are overlapping with e are deleted from the sweep-line status. The projections where the endpoints of e fall get truncated by the endpoints of e.

To identify the seed critical regions induced by the NW (resp. NE) corner incident to e, the sweep line is scanned to the left (resp. right) to identify matching corners to v. The scan is performed until either a vertical edge is encountered or $R_{max}$ is reached or the horizontal seed condition is violated. For every SE (resp. SW) matching corner found during the scan, the seed critical region is reported as in property 3.

3. A Max-distance event associated with a south edge e corresponds to the deletion from the sweep-line status of the projections induced by e.

While the invention has been described in terms of a single preferred embodiment, those skilled in the art will recognize that the invention can be practiced with modification within the spirit and scope of the appended claims.

Having thus described our invention, what we claim as new and desire to secure by letters patent is as follows:

1. A computer implemented method for critical area computation of defects in VLSI circuit manufacturing comprising the steps of:

a) retrieving a design layer containing a plurality of design shapes;

b) retrieving a list of defect sizes ordered in increasing size;

c) determining seed critical regions for said design layer;

d) listing said determined seed critical regions in an ordered list in order of increasing critical radius;

e) identifying all seed critical regions having a critical radius less than a minimum defect size and removing each said identified seed critical region from said ordered list; and f) generating an actual critical region for each said identified seed critical region.

2. The computer implemented method of claim 1 wherein the step (f) of generating an actual critical region comprises expanding each identified seed critical region by the difference between its critical radius and the critical radius of said minimum defect size, said generated actual critical region being rectangular.

3. The computer implemented method of claim 1 further comprising the steps of:

g) identifying all seed critical regions having a critical radius less than a next smallest defect size and removing each said identified seed critical region from said ordered list, said next smallest defect size being identified as a current defect size;

h) generating an actual critical region for each said identified seed critical region;

i) generating additional critical region by expanding the critical region of the previous defect size by the difference between said current defect size and said previous defect size; and j) repeating steps (g) through (i) for all listed defect sizes.

4. The computer implemented method of claim 3 wherein the step (a) of retrieving a design layer further comprises unioning overlapping shapes in the design layer.

5. The computer implemented method of claim 4 wherein the step (b) of determining seed critical regions comprises the steps of:

1) determining all horizontal seed critical regions; and, 2) determining all vertical seed critical regions.

6. A method of integrated circuit chip design including checking the design according to the computer implemented method of claim 1 and further comprising the step of:

g) modifying a design layer of said checked design based on said generated actual critical region to improve manufacturing yield; and h) rechecking said design using said computer implemented method.

7. A method of integrated circuit chip design according to claim 6 further comprising repeating steps (g) and (h) until a desired predicted yield is achieved.

8. A system for analyzing defect critical areas of integrated circuit chips, said system comprising:

means for storing a plurality of design shapes on a design layer;

means for determining seed critical regions for said stored design shapes;

means for organizing said determined seed critical regions according to a critical radius;

means for selectively eliminating all seed critical regions less than a minimum defect size; and means for generating an actual critical region for each remaining said seed critical region.

9. A system for analyzing defect critical areas integrated circuit chips as in claim 8, further comprising means for expanding each identified seed critical region according to the difference between a critical radius of said identified seed critical region and the critical radius of said minimum defect size.

10. A system for analyzing defect critical areas integrated circuit chips as in claim 8, further comprising means for unioning overlapping shapes in the design layer.

* * * * *